(12) United States Patent
Ohnuki et al.

(10) Patent No.: US 9,711,385 B2
(45) Date of Patent: Jul. 18, 2017

(54) SUBSTRATE STORAGE CONTAINER (71) Applicants: Shin-Etsu Polymer Co., Ltd., Tokyo (JP); Miraial Co., Ltd., Tokyo (JP)

(72) Inventors: Kazumasa Ohnuki, Saitama (JP); Hiroyuki Shida, Saitama (JP); Hiroki Yamagishi, Saitama (JP); Tsuyoshi Nagashima, Tokyo (JP); Shuichi Inoue, Tokyo (JP); Chiaki Matsutori, Tokyo (JP); Takaharu Oyama, Tokyo (JP)

(73) Assignees: Shin-Etsu Polymer Co., Ltd., Tokyo (JP); Miraial Co., Ltd., Tokyo (JP)

( * ) Notice: Subject to any disclaimer, the term of this patent is extended or adjusted under 35 U.S.C. 154(b) by 0 days.

(21) Appl. No.: 14/648,101

(22) PCT Filed: Nov. 21, 2013

(86) PCT No.: PCT/JP2013/081389
§ 371 (c)(1),
(2) Date: May 28, 2015

(87) PCT Pub. No.: WO2014/084115
PCT Pub. Date: Jun. 5, 2014

(65) Prior Publication Data
US 2015/0318195 A1     Nov. 5, 2015

(30) Foreign Application Priority Data
Nov. 28, 2012   (JP) ................................. 2012-259818

(51) Int. Cl.
*B65D 85/30*      (2006.01)
*H01L 21/673*     (2006.01)
*B65D 43/22*      (2006.01)

(52) U.S. Cl.
CPC ........ *H01L 21/67373* (2013.01); *B65D 43/22* (2013.01); *H01L 21/67376* (2013.01); *H01L 21/67386* (2013.01); *Y10S 206/832* (2013.01)

(58) Field of Classification Search
CPC ......... H01L 21/67373; H01L 21/67376; H01L 21/67386; Y10T 137/3584; B65D 85/48; Y10S 206/832
(Continued)

(56) References Cited

U.S. PATENT DOCUMENTS 5,570,987 A * 11/1996 McKenna ......... H01L 21/67373
414/416.01
5,711,427 A *  1/1998 Nyseth ............. H01L 21/67373
206/454
(Continued)

FOREIGN PATENT DOCUMENTS

JP    H11-159218 A    6/1999
JP    3904772 B2      4/2007
(Continued)

OTHER PUBLICATIONS

International Search Report issued in corresponding international application No. PCT/JP2013/081389, mailed Jan. 14, 2014 (6 pages).
(Continued)

*Primary Examiner* — Luan K Bui
(74) *Attorney, Agent, or Firm* — Osha Liang LLP (57) ABSTRACT

The substrate storage container includes: a container body for storing a semiconductor wafer; a lid body for opening and closing a front of the container body; and a locking mechanism for locking the lid body that has closed the front of the container body. The lid body is formed of a lid main body to be fitted to the front of the container body and a cover plate for covering a front face of the lid main body.
(Continued)

The locking mechanism includes a rotating operation portion that is pivotally supported by the lid main body and rotationally operated from an outside of the cover plate. A plurality of posture control members for the rotating operation portions are provided for, at least, the cover plate, among the cover plate and the rotating operation portion.

9 Claims, 5 Drawing Sheets

(58) Field of Classification Search
USPC ........ 206/454, 710, 711, 723; 220/323, 324; 292/64, 66
See application file for complete search history.

(56) References Cited

U.S. PATENT DOCUMENTS

| 5,957,292 | A | * | 9/1999 | Mikkelsen | ........ H01L 21/67373 206/454 |
| 6,430,877 | B1 | * | 8/2002 | Rosenquist | ............ E05C 9/042 49/395 |
| 7,182,203 | B2 | * | 2/2007 | Burns | ................. E05B 17/0041 206/710 |
| 7,828,341 | B2 | | 11/2010 | Hasegawa et al. | |
| 7,909,166 | B2 | * | 3/2011 | Lin | ................... H01L 21/67369 206/454 |
| 8,083,272 | B1 | * | 12/2011 | Wu | ................... H01L 21/67373 206/710 |
| 2002/0134784 | A1 | * | 9/2002 | Hsieh | ................ H01L 21/67373 220/323 |
| 2004/0040884 | A1 | * | 3/2004 | Pai | .................... H01L 21/67373 206/710 |
| 2009/0026109 | A1 | | 1/2009 | Hasegawa et al. | |
| 2012/0298549 | A1 | | 11/2012 | Fujimori et al. | |
| 2013/0248400 | A1 | * | 9/2013 | Ku | .................... H01L 21/67373 206/454 |

FOREIGN PATENT DOCUMENTS

| JP | 4208308 B2 | 1/2009 |
| JP | 4540529 B2 | 9/2010 |
| JP | 2012-182304 A | 9/2012 |
| TW | 201141767 A | 12/2011 |

OTHER PUBLICATIONS

International Preliminary Report on Patentability issued in corresponding international application No. PCT/JP2013/081389, mailed Jun. 11, 2015 (7 pages).

* cited by examiner

SUBSTRATE STORAGE CONTAINER

TECHNICAL FIELD

The present invention relates to a substrate storage container that is used to stores, preserves, conveys and transports substrates represented by semiconductor wafers.

BACKGROUND ART

Though not illustrated, a conventional substrate storage container includes a container body for accommodating a plurality of semiconductor wafers, a lid body that opens and closes the front of this container body and a locking mechanism for locking the lid body that closes the front of the container body, and is used when transporting semiconductor wafers to semiconductor manufacturing factories (see Patent Documents 1, 2 and 3).

The container body is molded in the form of a front-open box having such a size as to be able to hold semiconductor wafers of, for example 300 mm or larder in diameter, accommodated in alignment while a bottom plate is attached to the baseplate of the container body. A plurality of positioning tools that fit the positioning pins on the table of lid opening/closing equipment to do positioning are attached to either the baseplate or the bottom plate.

The lid body is composed of a lid main body having an approximately dish-like section and detachably fitted to the front of the container body and a cover plate that covers the open front of the lid main body. A locking mechanism is arranged between these lid main body and cover plate so as to be opened and closed automatically by lid opening/closing equipment. The cover plate is formed of a plate that is sized so as to correspond to the front of the lid main body while operation holes for the locking mechanism are formed in the center on either side of the cover plate.

The locking mechanism is formed of a pair of rotating operation portions that are pivotally supported by the lid main body of the lid body and rotationally operated from the outside and a plurality of latch bars that are projected from and retracted into the peripheral wall of the lid main body to thereby come into and out of contact with the inner periphery in the front of the container body. Each rotating operation portion is provided in the form of a disk having, for example, a pair of curved slots in its peripheral part, arranged opposing the operation hole of the cover plate, and rotated from the outside by means of an operation key of lid opening/closing equipment that is inserted through the operation hole.

In the thus configured substrate storage container, when the lid body is fitted to the open front of the container body and locked, the lid body is held by suction by means of lid opening/closing equipment so that the suction-held lid body is pressed to the open front of the container body and fitted shallowly. When the lid body has been shallowly fitted, the operation keys of lid opening/closing equipment are inserted into the operation holes of the cover plate, and the rotating operation portions of the locking mechanism are rotated so that a plurality of latch bars of the locking mechanism slide, respectively. As a result, the lid body is brought into tightly contact with the inner periphery in the front of container body, whereby the lid body perfectly fits to the front of the container body and strongly locked.

PRIOR ART DOCUMENTS

Patent Documents

Patent Document 1: Japanese Patent No. 3904772
Patent Document 2: Japanese Patent No. 4208308
Patent Document 3: Japanese Patent No. 4540529

SUMMARY OF THE INVENTION

Problems to be Solved by the Invention

In the conventional substrate storage container, the operation keys of lid opening/closing equipment are inserted into the operation holes of the cover plate so as to rotate the rotating operation portions of the locking mechanism, as described above. However, there occur some cases where the cover plate and rotating operation portions are obliquely pressed so that some part may float up when the operation keys are inserted. If this state of floating is left as is, the cover plate and the rotating operation portion held in a wrong posture touch each other causing damage or rub each other producing dust, which further poses a problem of pollution of semiconductor wafers and degrading the appearance of the lid body. This problem is more serious when the substrate storage container is a large type for storing semiconductor wafers of 450 mm in diameter because the rotating operation portions are also large.

The present invention has been devised in view of the above, it is therefore an object of the present invention to provide a substrate storage container that can prevent the cover plate and rotating operation portions of its lid body from touching each other causing damage and/or rubbing each other producing dust.

Means for Solving the Problems

In order to solve the above problem, a substrate storage container of the present invention includes: a container body for storing a substrate; a lid body for opening and closing an opening of the container body; and a locking mechanism for locking the lid body that has closed the opening of the container body, wherein the lid body includes a lid main body to be fitted to the opening of the container body and a cover plate for covering an open surface of the lid main body, the locking mechanism includes a rotating operation portion that is supported by the lid main body and rotationally operated from an outside of the cover plate and a plurality of locking members that slide as the rotating operation portion rotates and project from, and retract into, a peripheral wall of the container body and come into and out of contact with an inner periphery of the opening of the container body, and a posture control member for controlling a posture of the rotating operation portion is provided for, at least, the cover plate, among the cover plate of the lid body and the rotating operation portion of the locking mechanism.

Here, the posture control member that comes into point contact or line contact with a peripheral part of the rotating operation portion may be provided on an opposite surface of the cover plate of the lid body, the opposite surface being opposite to the lid main body.

Further, an enclosing rib for the rotating operation portion of the locking mechanism may be formed on the opposite surface of the cover plate, and a plurality of posture control members may be provided within this enclosing rib.

The posture control member that comes into point contact or line contact with the lid main body of the lid body may be provided in the rotating operation portion of the locking mechanism.

It is possible to provide a configuration that a fixing means for fixture between the lid main body and the cover plate of the lid body and a positioning means for positioning the cover plate to the lid main body is further provided, the cover plate has optical permeability and is formed with a positioning hollow and a detection target, and, the positioning means includes a plurality of first positioning members formed on an opposite surface of the lid main body and a plurality of second positioning members formed on an opposite surface of the cover plate, the plurality of first positioning members are arranged with an interval and made different in size each other and each first positioning member is curved with an opening defined around between both ends thereof while the plurality of second positioning members are arranged with an interval and made different in size each other and each second positioning member is curved along the first positioning member and curved with an opening defined around between both ends thereof.

Further, the plurality of first and second positioning members may be formed in any of an approximate semicircular arc, an approximate horseshoe shape, approximate inverted V-shape, approximate C-shape, approximate U-shape and approximate V-shape.

Herein, the substrate in the scope of claims, at least, include a semiconductor wafer, a liquid crystal substrate, a glass substrate and the like of, 200 mm, 300 mm and 450 mm in diameter. The container body and the lid body may be either transparent, opaque or translucent. The container body may be mainly of a front open type, but may be of a top open type. A necessary number of the posture control members may be provided for the cover plate of the lid body, or necessary numbers of the posture control members may be provided for both the cover plate and the rotating operation portion of the locking mechanism. The posture control members are preferably able to come in contact with, at least, the peripheral part of the rotating operation portion, but may be brought into contact with points other than the peripheral part of the rotating operation portion.

The fixing means corresponds to (1) combination of a plurality of threaded bosses formed in the lid main body and screw parts (screws, bolts, etc.) to be penetrated through the cover plate and screw-fastened to the corresponding plurality of threaded bosses, (2) combination of a plurality of engaging hollows formed in the lid main body and engaging projections projected from the cover plate and engaged with the corresponding plurality of engaging hollows, (3) combination of a plurality of cylindrical bosses formed in the lid main body and ribs projected from the cover plate and fitted on the corresponding plurality of bosses, and the like.

The positioning means may be provided in the central part, side part and others of the lid main body and cover plate. When formed in a curve, the plurality of first positioning members of this positioning means are preferably formed with a radius of curvature or curvature different from each other. The situation of the plurality of second positioning members in this aspect is the same. The openings of the first and second positioning members are preferably oriented downwards, but may be directed upwards, obliquely downwards, leftwards and rightwards. The second positioning member is preferably arranged along the peripheral surface of the first positioning member with a clearance apart therefrom. However, the clearance does not have to be necessarily provided.

According to the present invention, even if the cover plate or the like of the lid body is pressed by lid opening/closing equipment or the like when the locking mechanism is operated upon attachment of the lid body to or its removal from the container body, the posture control members come into contact with the rotating operation portions of the locking mechanism to prevent deterioration of the posture. Accordingly, the posture of the rotating operation portion will be hardly degraded or fluctuated.

Advantages of the Invention

The present invention produces the advantages of suppressing damage due to contact between the cover plate of the lid body and the rotating operation portion and generation of dust due to rubbing when the rotating operation portion of the locking mechanism is turned and operated. Further, this advantages can prevent pollution of substrates and degradation of the appearance of the lid body.

According to the invention recited in claim 2, the posture control members are brought into contact with the rotating operation portion at the outer peripheral part on which stronger operating force is acted than to the central part and its vicinity of the rotating operation portion, it is possible to control the posture of the rotating operation portion in a more suitable way. Further, since the posture control member is not put in surface contact but is brought into point or line contact so as to decrease the contact area, it is possible to turn the rotating operation portion stably while suppressing damage to the posture control members and generation of dust.

According to the present invention recited in claim 3, it is possible to control the posture of the rotating operation portion in a more reliable manner. Further, since the posture control member is not put in surface contact with the lid main body but is brought into point or line contact therewith so as to decrease the contact area, it is possible to turn the rotating operation portion stably while suppressing damage to the posture control members and generation of dust.

According to the present invention recited in claim 4, the positioning means effectively prevents distortion and displacement of the cover plate, hence deviation of the positioning hollows and the detection targets of the cover plate hardly occur. As a result, it is possible to make the detection sensor of the lid opening/closing equipment detect the detection targets of the lid body correctly, hence prevent occurrence of an event in which the lid opening/closing equipment should stop operation in the middle of the lid opening and closing work. Further, since the positioning means enables easy visual distinction of the orientation of the cover plate, there is little risk of the cover plate being erroneously attached in a reversed direction, hence it is possible to expect simplification and speedup of the assembly work of the lid body.

Further, when the openings of the first and second positioning members are both oriented downwards, it is possible to smoothly drain rinse water when the lid body is washed. Accordingly, it is possible to improve drainability and water removability of the lid body at the time of washing and bring advantage in drying work after washing.

MODE FOR CARRYING OUT THE INVENTION

A preferred embodiment of the present invention will be described hereinbelow with reference to the drawings. The substrate storage container in the present embodiment includes: as shown in FIGS. 1 to 10, a container body 1 for holding a plurality of semiconductor wafers in alignment; a transparent lid body 10 for opening and closing a front of the container body 1; and a locking mechanism 30 for locking lid body 10 that closes the front of container body 1. The lid main body 11 and cover plate 19 that form lid body 10 are provided with fixing means 40 and positioning means 50 while, at least, cover plate 19 of lid body 10 is formed with a plurality of posture control members 60 for locking mechanism 30.

Though not illustrated, the semiconductor wafer is a thin and heavy large-sized silicon wafer having a diameter of 450 mm, for example; a plurality of wafers (e.g., 10 wafers, 25 wafers, or the like) are accommodated horizontally inside container body 1 and arranged in alignment in vertical direction.

Container body 1, lid body 10, locking mechanism 30, positioning means 50 and posture control members 60 are injection molded as a plurality of separated parts, of molding material containing prescribed resins, and these plurality of parts are assembled. Examples of the resins contained in the molding material may include thermoplastic resin such as polycarbonate, cycloolefin polymer, polyether imide, polyether ketone, polyether ether ketone, polybutylene terephthalate, polyacetal, and liquid crystal polymer, and alloys of these, and the like.

These resins are added with conductive components such as carbon fiber, carbon powder, carbon nanotubes and conductive polymers, and anionic, cationic, nonionic and other various kinds of antistatic agents, as required. Further, UV absorbers of benzotriazole, salicylate, cyanoacrylate, oxalic acid anilide and/or hindered amine may be added. Glass fibers, carbon fibers and the like may be optionally added in order to improve rigidity.

Figure 1:
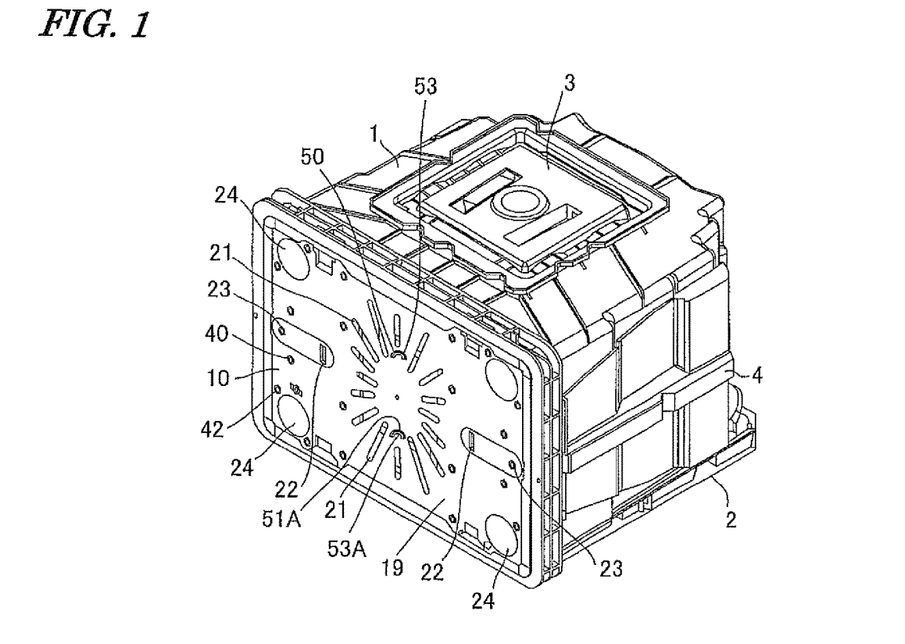
FIG. 1 is an overall perspective view schematically showing an embodiment of a substrate storage container according to the present invention.
Figure 2:
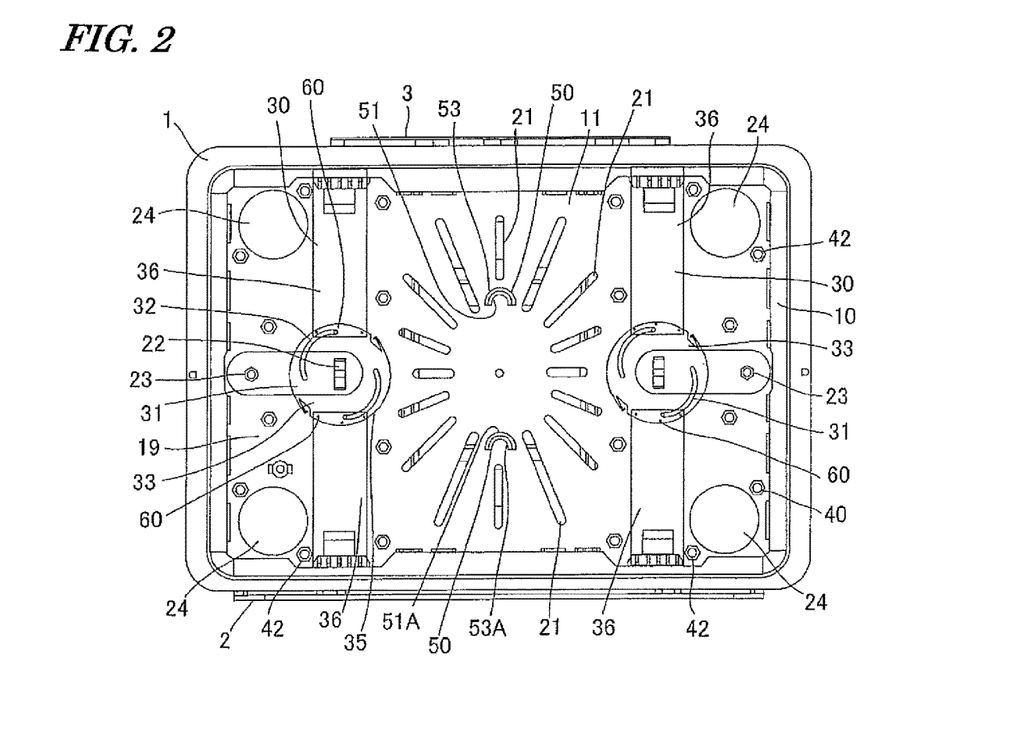
FIG. 2 is a front illustrative view schematically showing the embodiment of the substrate storage container according to the present invention.

As shown in FIGS. 1 and 2, container body 1 is formed of a front open box having an open front made of prescribed molding material while pairs of supporting pieces, each left and right pair being formed on both sides inside the box, or on the interior surfaces of both side walls, to horizontally support semiconductor wafers, are arranged vertically with a predetermined pitch. Each supporting piece is formed as an elongate plate extended in the front-to-rear direction.

Bottom plate 2 for lid opening/closing equipment is screw fixed from below to the baseplate of container body 1. A plurality of positioning tools that fit the positioning pins on the table of lid opening/closing equipment from above to do positioning are arranged to either the baseplate or the bottom plate 2. On the top center of container body 1, a robotic flange 3 for transportation to be gripped by the ceiling transfer system in semiconductor manufacturing factories is attached.

The front of container body 1 is formed so that the peripheral part is stretched out curvedly outwards while locking holes for locking mechanism 30 are hollowed at both sides on the upper and both sides on the lower of the inner periphery. Further, a forklift flange 4 for transportation is projectively formed in the front-to-rear direction in the lower part on the outer surface of each of the side walls of container body 1.

As shown in FIGS. 1 through 6, lid body 10 is formed of an approximately dish-like section shaped shallow lid main body 11 to be detachably press fitted to the front of container body 1 and a transparent cover plate 19 to be detachably fitted to cover an open front face 12 of the lid main body 11 with locking mechanism 30 interposed between these lid main body 11 and cover plate 19, and is automatically opened and closed by lid opening/closing equipment.

Figure 3:
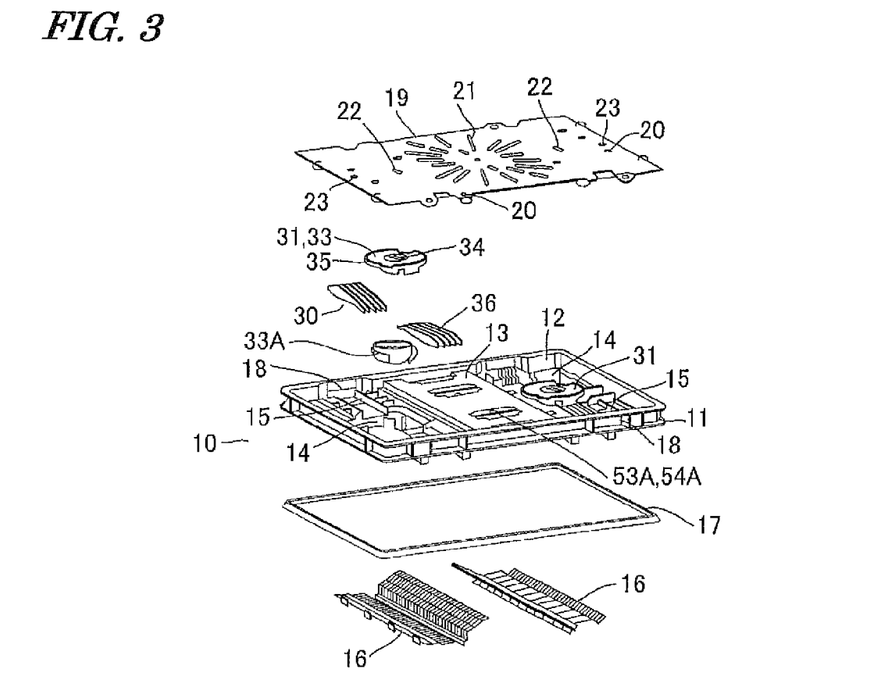
FIG. 3 is an exploded perspective view schematically showing a lid body in the embodiment of the substrate storage container according to the present invention.
Figure 5:
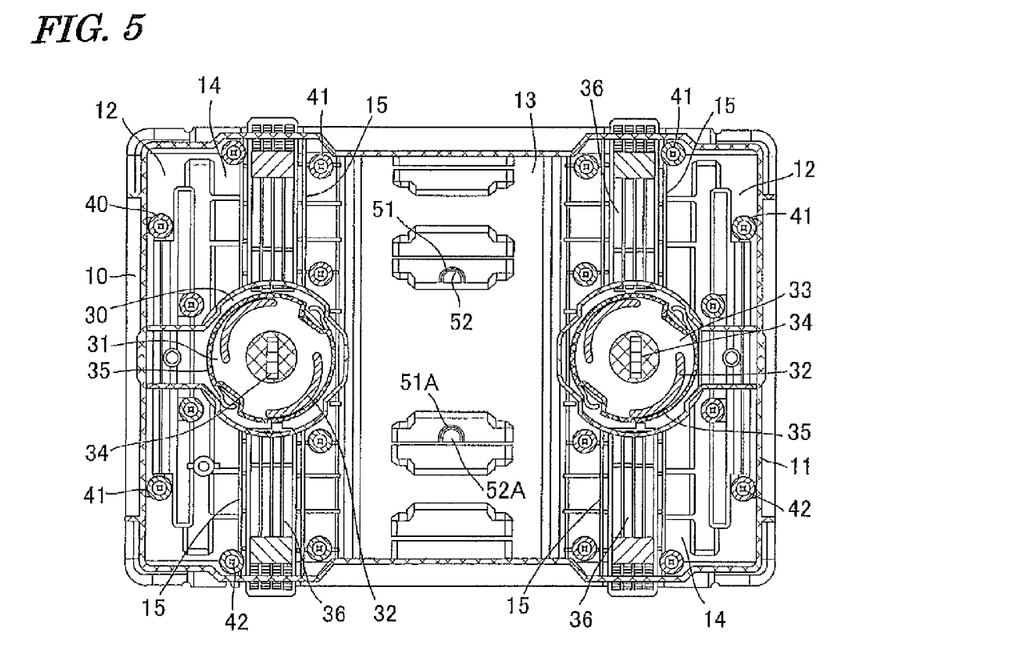
FIG. 5 is a front illustrative view schematically showing a lid main body in the embodiment of the substrate storage container according to the present invention.

Lid main body 11 has optical permeability and transparency and has a raised part 13 of a rectangular shape viewed from the front, integrally formed in the center on the open front face 12 side. A pair of mount sections 14 for locking mechanism 30 are defined on the left and right sides of this raised part 13. In each mount section 14, a pair of guide ribs 15 for locking mechanism 30 are integrally formed left and right and extended in the vertical direction. These paired guide ribs 15 are spaced opposing each other.

Attached to lid main body 11 are a pair of front retainers 16 that are arranged at both sides on the backside or rear side facing the front peripheries of the plurality of wafers accommodated in alignment in container body 1 to support the front periphery of each semiconductor wafer by elastic hold pieces. A frame-shaped gasket groove is cut out in the periphery on the rear side or in the peripheral wall of lid main body 11. Fitted to this gasket groove is a frame-shaped gasket 17 that will deform by being pressed against the inner periphery on the front face of container body 1. Retraction holes 18 opposing the locking holes of container body 1 are formed at both sides on the top and both sides on the bottom of the peripheral wall of lid main body 11.

Figure 6:
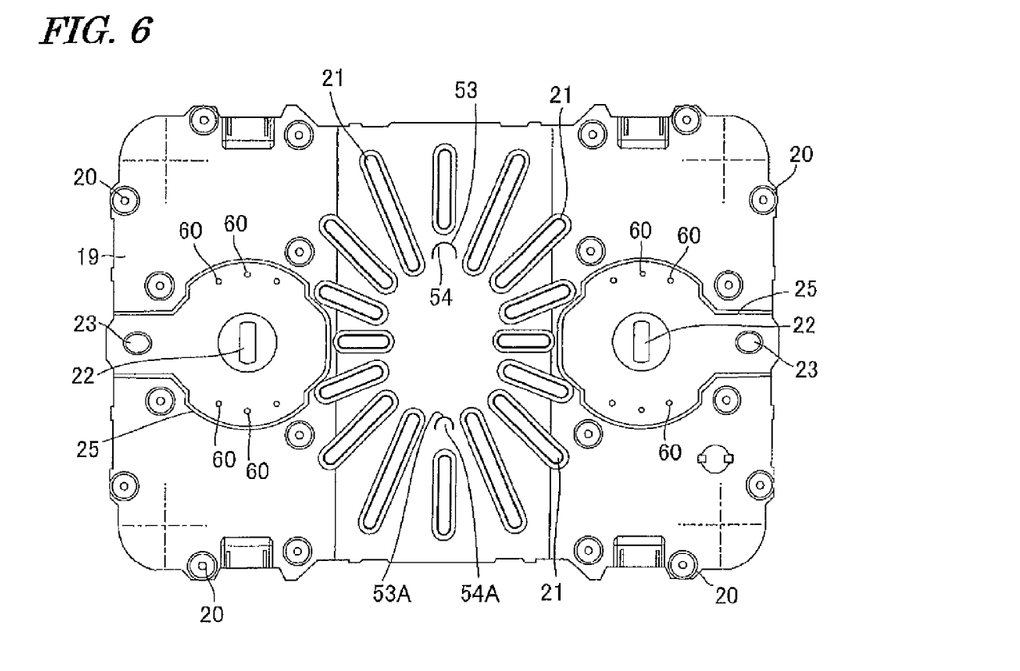
FIG. 6 is a backside illustrative view schematically showing a cover plate in the embodiment of the substrate storage container according to the present invention.

Cover plate 19 is a plate sized corresponding to front face 12 of lid main body 11 and formed with a plurality of screw holes 20 for fixing means 40. This cover plate 19 has a plurality of washing slots 21 formed in the central part thereof and a pair of operation holes 22 for locking mechanism 30 formed in the centers of the left and right halves. A plurality of washing slots 21 include a plurality of long washing slots 21 and a plurality of short washing slots 21, these being extended approximately radially from the central part of cover plate 19 and arranged opposite to raised portion 13 of lid main body 11.

A pair of positioning hollow 23 each forming a hollow are arranged close to the periphery on the left and right sides on the surface of cover plate 19 exposed to the outside while detection targets 24 to be detected by detection sensors (e.g., photoelectric sensors) of lid opening/closing equipment are formed at the corners, e.g., four corners, of the cover plate 19 surface, each detection target 24 being formed in a flat circular shape. Further, on the backside of cover plate 19 opposite to lid main body 11, an enclosing rib 25 for locking mechanism 30 is formed on either side of cover plate 19, next to the plurality of washing slots 21. Each enclosing rib 25 encloses operation hole 22 and functions to limit the extent of pollution of dust generated at the time of operation of locking mechanism 30.

As shown in FIGS. 2 to 5 and 7, locking mechanism 30 includes: a pair of left and right rotating operation portions 31, which are pivotally supported in a pair of mount sections 14 of lid main body 11 respectively and rotated from the outside; and a plurality of latch bars 36 that each slide in the vertical direction of lid body 10 and project out of and retract into retraction hole 18 of lid main body 11 to come into and out of contact with the locking hole of container body 1 as each rotating operation portion 31 rotates.

Figure 7:
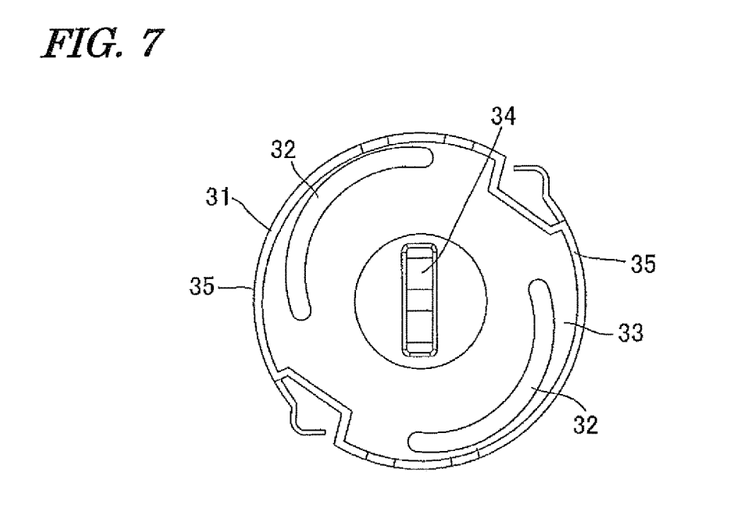
FIG. 7 is a front illustrative view schematically showing a rotating operation portion of a locking mechanism in the embodiment of the substrate storage container according to the present invention.

Each rotating operation portion 31 is formed by combination in the front-to-rear direction of two rotary plates 33 and 33A having a pair of curved slots 32 along their periphery, for example. These two rotary plates 33 and 33A have approximately disk-like or approximately cylindrical configurations that can be fitted to each other, and have a key hole 34 at the center opposite to operation hole 22 of cover plate 19. The operation key of lid opening/closing equipment passing through operation hole 22 is removably inserted into the key hole 34.

Among the two rotary plates 33 and 33A, the rotary plate 33 located on the cover plate 19 side has an abutment 35 integrally formed along the periphery thereof. A plurality of posture control members 60 abut this abutment 35. The thus configured rotating operation portion 31 is enclosed by enclosing rib 25 of cover plate 19 with its key hole 34 opposite to operation hole 22, and rotationally operated by the operation key of lid opening/closing equipment inserted through operation hole 22.

Each latch bar 36 are configured by an elongate plate-like form. In a state that one end of each latch bar is held between two rotary plates 33 and 33A, each latch bar is slidably laid out between a pair of guide ribs 15 in mount sections 14. A coupling pin 37 that slidably fits in curved slot 32 of rotating operation portion 31 is projectively formed in the end of this latch bar 36.

As shown in FIGS. 2, 5 and 6, fixing means 40 includes, for example, a plurality of female-threaded bosses 41 cylindrically projected from front face 12 of lid main body 11 and male screws 42 screw fitted to corresponding female-threaded bosses 41, functioning to removably fix and integrate cover plate 19 with lid main body 11. The plurality of female-threaded bosses 41 are integrally formed in the periphery of raised portion 13 and in the mount sections 14 of lid main body 11. Male screws 42 are screw fitted into female-threaded bosses 41 through a plurality of screw holes 20 formed in cover plate 19.

Figure 8:
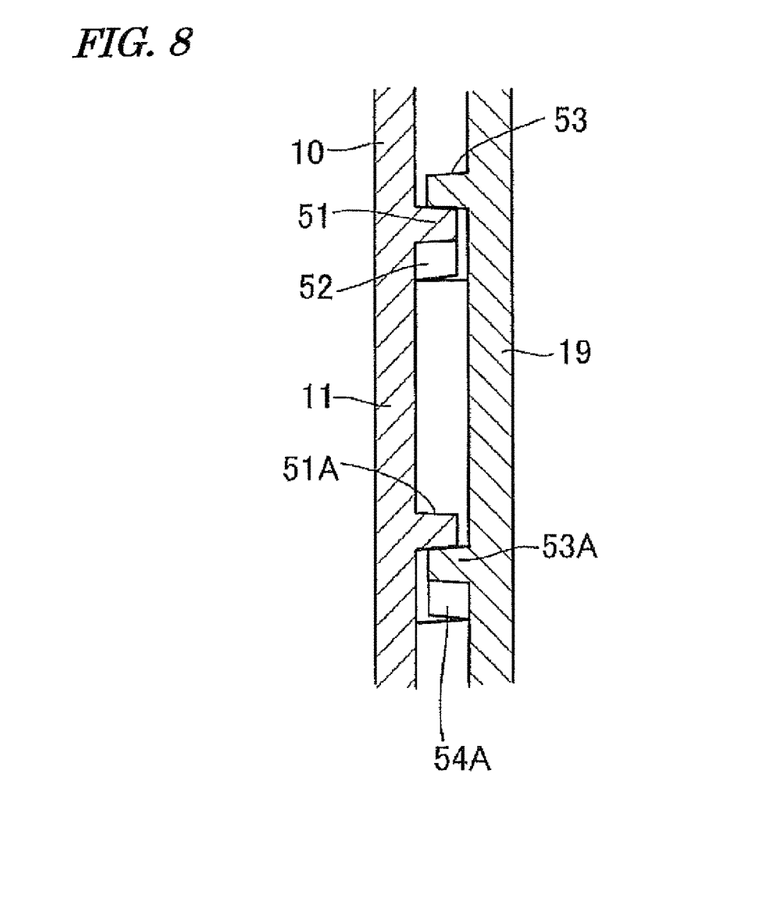
FIG. 8 is a sectional illustrative view schematically showing a plurality of first and second positioning members in the embodiment of the substrate storage container according to the present invention.

Positioning means 50 includes, as shown in FIGS. 1, 2, 5 and 8 to 10, a pair of first positioning members 51 and 51A that are arranged and formed in raised portion 13 of lid main body 11 so as to project toward cover plate 19, and a pair of second positioning members 53 and 53A that are arranged and formed on the backside of cover plate 19 so as to project toward lid main body 11, these plurality of first and second positioning members 51·51A and 53·53A mesh each other in the thickness direction of lid body 10 (see FIG. 8).

Paired first positioning members 51 and 51A are laid out vertically apart from each other on the surface of raised portion 13 and formed in different sizes, the first positioning member 51 located above being formed smaller than the first positioning member 51A located below, in view of easy visual distinction and in view of preventing vertical displacement by fitting them with second positioning members 53 and 53A alternately.

Each of first positioning members 51 and 51A is curvedly formed in an approximately semi-circular arc. An opening 52 is formed between both ends of first positioning member 51 while an opening 52A is formed between both ends of first positioning member 51A. These openings 52 and 52A are both oriented downward of lid body 10 so as to prevent rinse water at the time of washing from staying.

Paired second positioning members 53 and 53A are laid out vertically apart from each other in the center part on the backside of cover plate 19 and formed in different sizes in view of easy visual distinction, the second positioning member 53 located above being formed larger than the second positioning member 53A located below (see FIGS. 9 and 10).

Second positioning members 53 and 53A are each curvedly formed in an approximately semi-circular arc, and positioned close to the ends of washing slots 21 and are formed along either the inner or outer circumferential side of first positioning members 51 and 51A with their ends made flush with the ends of first positioning members 51 and 51A, respectively. An opening 54 is formed between both ends of second positioning member 53 while an opening 54A is formed between both ends of second positioning member 53A. These openings 54 and 54A are both oriented downward of lid body 10 so as to improve drainability and water removability at the time of washing.

Figure 9:
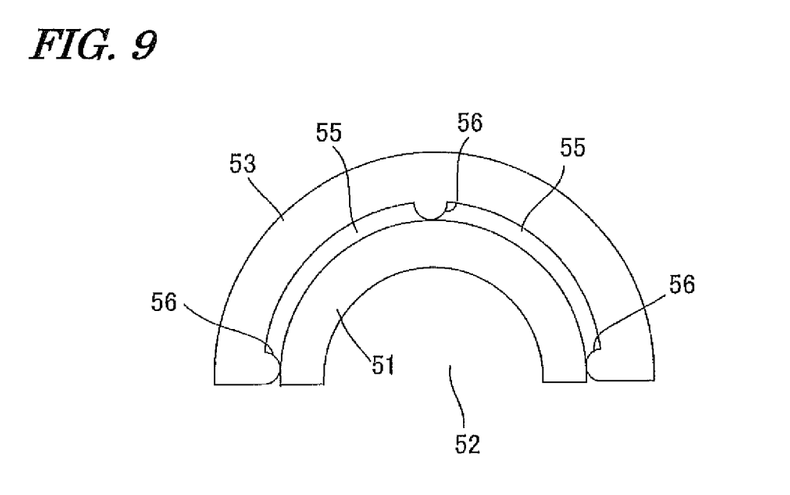
FIG. 9 is an enlarged illustrative view schematically showing upper first and second positioning members in the embodiment of the substrate storage container according to the present invention.

The second positioning member 53 located above has a greater inside diameter than the outside diameter of the first positioning member 51 located above, as shown in FIG. 9, and is preferably opposite the outer peripheral surface of first positioning member 51, leaving a slight clearance 55 for drainage. The second positioning member 53 has a plurality of projections 56 that come into point contact with the outer peripheral surface of first positioning member 51, the plurality of projections 56 being formed and arranged at both ends and the center on the inner peripheral surface of second positioning member 53 with an interval between the projections. Each projection 56 is formed in a minute and approximately semicircular shape in front view, from the viewpoint of suppressing generation of particles due to abrasion. This upper second positioning member 53 can be correctly opposite to the upper located first positioning member 51 only.

Figure 10:
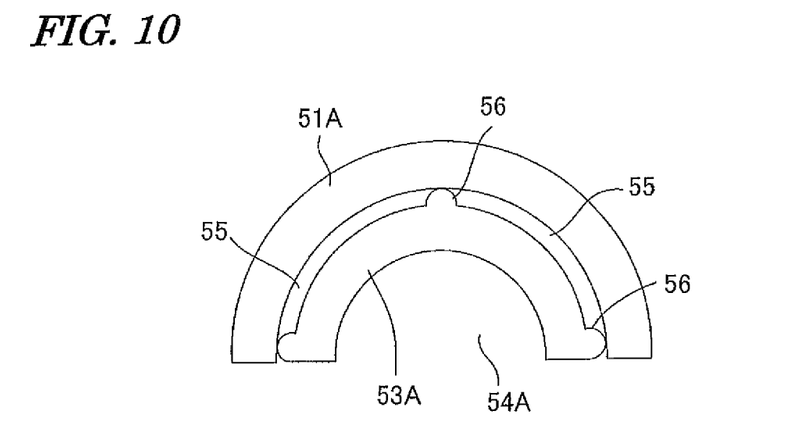
FIG. 10 is an enlarged illustrative view schematically showing lower first and second positioning members in the embodiment of the substrate storage container according to the present invention.

In contrast, the second positioning member 53A located below has a smaller outside diameter than the inside diameter of the first positioning member 51A located below, as shown in FIG. 10, and is preferably opposite to the inner peripheral surface of first positioning member 51A, leaving a slight clearance 55 for drainage. The second positioning member 53A has a plurality of projections 56 that come into point contact with the inner peripheral surface of first positioning member 51A, the projections being formed and arranged at both ends and the center on the outer peripheral surface of second positioning member 53A with an interval between the projections. Each projection 56 is formed in a minute and approximately semicircular shape in order to suppress generation of particles due to abrasion. This lower located second positioning member 53A can be correctly opposite to the lower located first positioning member 51A only.

The first and second positioning members 51 and 53 located above and the first and second positioning members 51A and 53A located below are thus configured, so that these parts are arranged asymmetrically with respect to the horizontal center line of lid body 10, hence it is possible to effectively eliminate the risk of cover plate 19 being erroneously attached upside down at the time of assembling lid body 10.

Further, since the second positioning member 53 located above on cover plate 19 is positioned on the outer peripheral side (on the upper side in FIG. 8) of first positioning member 51 formed on lid main body 11 while the second positioning member 53A located below on cover plate 19 is positioned on the inner peripheral side (on the lower side in FIG. 8) of first positioning member 51A formed on lid main body 11, the cover plate 19 fitted to lid main body 11 is constrained from moving in the left-and-right direction and in the vertical direction in FIG. 2, hence is exactly positioned.

Figure 4:
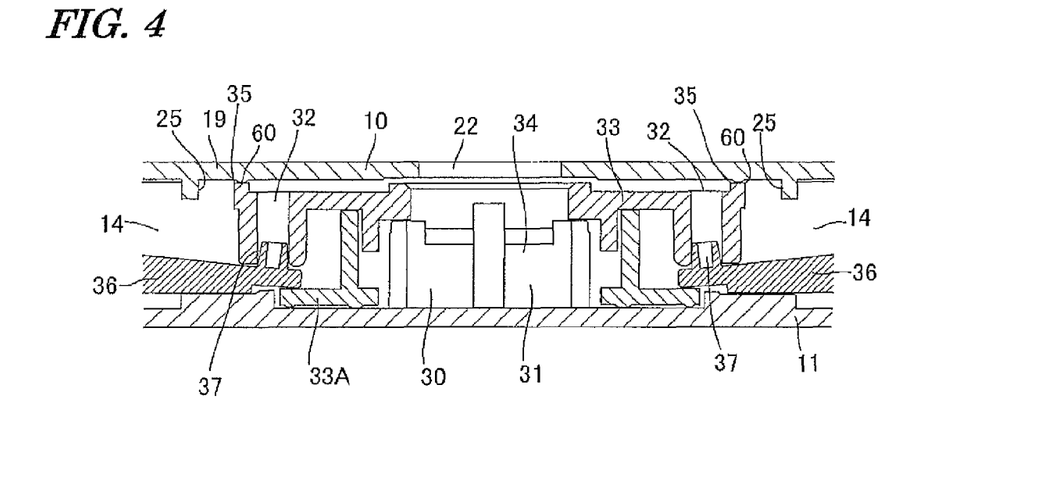
FIG. 4 is a sectional illustrative view schematically showing the lid body in the embodiment of the substrate storage container according to the present invention.

The plurality of posture control members 60 are arranged and formed near the periphery of each enclosing rib 25 with an interval between the posture control members, as shown in FIGS. 2, 4 and 6, the posture control members being opposite to the peripheral part including the vicinity of the maximum outside diameter of rotating operation portion 31. Each posture control member 60 is formed as a small projection having an approximately semicircular section in order to suppress damage to rotating operation portion 31 and generation of particles and creates point contact with the opposite surface of the abutment 35 of rotary plate 33 forming rotating operation portion 31.

In the above configuration, in assembling lid body 10, covers plate 19 is placed over the open front face 12 of lid main body 11 and the projections 56 of second positioning members 53 and 53A are brought into contact with the paired first positioning members 51 and 51A of lid main body 11, so that lid main body 11 and cover plate 19 are correctly positioned with respect to the vertical and horizontal directions. At this time, since the paired first positioning members 51 and 51A have different size from each other, the orientation of lid main body 11 to cover plate 19 can be appropriately recognized.

Further, if cover plate 19 in its upside-down position is about to be covered by mistake, first positioning member 51 interferes with second positioning member 53A and its plurality of projections 56 while second positioning member 53 and the plurality of projections 56 come into contact with first positioning member 51A, so that correct mating and abutment between first and second positioning members 51•51A and 53•53A are prohibited. Accordingly, it is possible to easily notice the mistake of the cover plate 19 being put upside down.

When lid main body 11 and cover plate 19 have been correctly positioned, the plurality of male screws 42 are screwed successively to the female-threaded bosses 41 from the cover plate 19 side, whereby cover plate 19 is covered and attached to lid main body 11 with high precision to complete assembly of lid body 10. In this process, if cover plate 19 is slightly rotated in the rotational direction of male screw 42, the plurality of projections 56 limit rotation of cover plate 19, so that it is possible to eliminate the risk of cover plate 19 being fixed in a deformed state, hence it is possible to expect correct alignment of female-threaded bosses 41 with screw holes 20 of cover plate 19.

Next description will be given on the case where lid body 10 is fitted and locked to the open front of container body 1 of the substrate storage container. In this case, at first, lid opening/closing equipment holds lid body 10 by vacuum suction so that the lid body 10 suctioned and held is shallowly press fitted into the open front of container body 1. When the lid body 10 has been shallowly fitted, the operation keys of lid opening/closing equipment penetrate through the operation holes 22 of cover plate 19 to be inserted into keyholes 34 of rotating operation portions 31 of locking mechanism 30 so that rotating operation portions 31 are rotated in the locking direction.

If rotating operation portion 31 is about to partly float as cover plate 19 is obliquely pressed when the operation key is inserted, each posture control member 60 comes into point contact with abutment 35 of rotary plate 33 of rotating operation portion 31 so as to prevent rotating operation portion 31 from losing balance with respect to the thickness direction of lid body 10. As rotating operation portion 31 is turned in the locking direction, the plurality of latch bars 36 of locking mechanism 30 slide in vertical direction and fit into and strongly engage the interior of the locking holes of container body 1. This fitting and engagement of latch bars 36 causes lid body 10 to be drawn into the front face of container body 1 to complete fitting and achieve strongly locking of lid body 10.

Also when rotating operation portion 31 is turned in the direction opposite to the locking direction or in the unlocking direction, cover plate 19 is obliquely pressed so that part of rotating operation portion 31 tends to float. However, because posture control members 60 abut abutment 35 of rotary plate 33 at points thereof, rotating operation portion 31 will be kept a balance thereof.

According to the above configuration, since the plurality of posture control members 60 regulates the posture of rotating operation portion 31, stable rotation of rotating operation portion 31 can be expected. As a result, there is no risk that cover plate 19 and the rotating operation portion 31 in its dislodged position interfere with each other to cause damage, rub each other and generate particles to pollute semiconductor wafers and degrade the appearance of lid body 10. This effect is especially meaningful when the substrate storage container is a large-sized type that accommodates semiconductor wafers of 450 mm in diameter because rotating operation portions 31 become bigger.

Further, since positioning means 50 effectively prevents distortion and displacement of cover plate 19, there is no risk of the positioning hollows 23 and detection targets 24 of cover plate 19 being deviated. Accordingly, it is possible for the detection sensor of lid opening/closing equipment to correctly detect detection targets 24 of lid body 10, hence prevent the problem of the lid opening/closing equipment being stopped in the middle of the opening and closing operation of lid body 10. This effect is especially meaningful when the substrate storage container is a large-sized type that accommodates semiconductor wafers of 450 mm in diameter.

Since positioning means 50 enables easy visual distinction between the top and bottom of cover plate 19, it is possible to simplify and smoothen assembly work without any risk of cover plate 19 being erroneously attached upside down. Further, since instead of bringing the first positioning members 51 and 51A into surface contact with second positioning members 53 and 53A, projections 56 of second positioning members 53 and 53A touch at points, it is possible to suppress abrasion and prevent pollution of semiconductor wafers due to generation of particles.

Moreover, openings 52 and 54 of first and second positioning members 51·51A and 53·53A are both oriented downwards while clearances 55 for flowing liquid are defined between first and second positioning members 51·51A and 53·53A with minute projections 56, there is no risk of the circulation of rinsing water being hindered when lid body 10 is washed under supersonic irradiation or the like. Accordingly, it is possible to improve drainability and water removability of lid body 10 at the time of washing and bring advantage in drying work after washing.

Further, even if, for example, a dimensional error of positioning means 50 occurs due to defects during molding, it is possible to oppose first and second positioning members 51 and 53 and oppose first and second positioning members 51A and 53A correctly and bring first positioning member 51 in contact with second positioning member 53 and bring first positioning member 51A in contact with second positioning member 53A, by adding some small modifications to projections 56.

Though in the above embodiment, detection targets 24 are formed at four corners on the front surface of cover plate 19, detection targets 24 may be formed at two opposing corners in a diagonal direction while each detection target 24 may be implemented by flat mirror finishing. It is also possible to form higher (thicker) part or lower (thinner) part other than the other part in the periphery of rotary plate 33 so as to be used as abutment 35. Though in the above embodiment the second positioning member 53 is laid out opposite to first positioning member 51, a plurality of second positioning members 53 may be laid out opposite to the inner and outer peripheral surfaces of first positioning member 51. Similarly, a plurality of second positioning members 53A may also be laid out opposite to the inner and outer peripheral surfaces of first positioning member 51A.

The only opening 52 may be formed for first and second positioning members 51 and 51A, or the only opening 54 can be formed for second positioning members 53 and 53A. The plurality of projections 56 may be arranged and formed at intervals on either the inner or outer peripheral surface of first positioning members 51 and 51A. Further, the plurality of projections 56 may be arranged and formed at intervals on the peripheral surface of both first and second positioning members 51·51A and 53·53A. Also, first and second positioning members 51·51A and 53·53A may be colored with different colors from each other so as to enable easy visual distinction.

The first and second positioning members 51·51A and 53·53A may be formed in an approximately U-shape so as to orient their openings 52 and 54 of first and second positioning members 51·51A and 53·53A downward. Further, the first positioning member 51 located above may be made bigger than the first positioning member 51A located below. In this case, the second positioning member 53 located above in cover plate 19 should be located on the inner peripheral side (lower side in FIG. 8) of first positioning member 51 formed on lid main body 11 while the second positioning member 53A located below in cover plate 19 should be located on the outer peripheral side (upper side in FIG. 8) of first positioning member 51A formed on lid main body 11.

The projection 56 may be formed in a small, approximately triangular shape in front view so that the projection 56 will touch along a line instead of a point contact. Further, as shown in FIG. 4, the plurality of posture control members 60 that come in point contact with mount section 14 may be arranged near the periphery of the opposite surface of rotary plate 33A that is opposite to mount section 14 so as to make rotating operation portion 31 turn stably. Other than the circular arrangement in a plan view, posture control members 60 may be arranged in an elliptic shape, obround shape, triangular shape, rectangular shape, polygonal shape or the like. This posture control member 60 may have a section of an arced shape, curved shape, triangular shape, pentagonal shape or the like other than a semicircular shape so that the posture control member will touch the rotary plate 33 of rotating operation portion 31 at a point or along a line.

In this way, posture control member 60 may be formed with a shape having a projection that can come in point or line contact with the rotating operation portion 31. In particular, when the sectional shape of posture control member 60 is formed to be semicircular or curved, the rotating operation portion 31 and posture control member 60 can be effectively prevented from being damaged or worn out when these rotating operation portion 31 and posture control member 60 touch each other.

INDUSTRIAL APPLICABILITY

The substrate storage container according to the present invention is used in semiconductors and liquid crystal manufacturing fields and the like.

DESCRIPTION OF REFERENCE NUMERALS 1 container body
10 lid body
11 lid main body
12 front
13 raised portion
14 mount section
19 cover plate
20 screw hole
23 positioning hollow
24 detection target
25 enclosing rib
30 locking mechanism
31 rotating operation portion
33 rotary plate
33A rotary plate
35 abutment
36 latch bar (locking member)
40 fixing means
41 female-threaded boss
42 male screw
50 positioning means
51 first positioning member
51A first positioning member
52 opening
53 second positioning member
53A second positioning member
54 opening
55 clearance
56 projection
60 posture control member

The invention claimed is:

1. A substrate storage container comprising:
a container body for storing a substrate;
a lid body for opening and closing an opening of the container body; and
a locking mechanism for locking the lid body that has closed the opening of the container body, wherein
the lid body includes a lid main body to be fitted to the opening of the container body and a cover plate for covering an open surface of the lid main body, the locking mechanism includes a rotating operation portion that is supported by the lid main body and rotationally operated from an outside of the cover plate and a plurality of locking members that slide as the rotating operation portion rotates and project from, and retract into, a peripheral wall of the container body and come into and out of contact with an inner periphery of the opening of the container body,
a posture control member for controlling a posture of the rotating operation portion is provided on, at least, the cover plate, among the cover plate of the lid body and the rotating operation portion of the locking mechanism, and
the posture control member that comes into point contact or line contact with a peripheral part of the rotating operation portion is provided on an opposite surface of the cover plate of the lid body, the opposite surface being opposite to the lid main body.

2. The substrate storage container according to claim 1, wherein the posture control member that comes into point contact or line contact with the lid main body of the lid body is provided in the rotating operation portion of the locking mechanism.

3. The substrate storage container according to claim 1, further comprising:
a fixing means for fixture between the lid main body and the cover plate of the lid body and a positioning means for positioning the cover plate to the lid main body, wherein
the cover plate has optical permeability and is formed with a positioning hollow and a detection target, and,
the positioning means includes a plurality of first positioning members formed on an opposite surface of the lid main body and a plurality of second positioning members formed on an opposite surface of the cover plate, the plurality of first positioning members are arranged with an interval and made different in size each other and each first positioning member is curved with an opening defined around between both ends thereof while the plurality of second positioning members are arranged with an interval and made different in size each other and each second positioning member is curved along the first positioning member and curved with an opening defined around between both ends thereof.

4. The substrate storage container according to claim 2, further comprising;
a fixing means for fixture between the lid main body and the cover plate of the lid body and a positioning means for positioning the cover plate to the lid main body, wherein
the cover plate has optical permeability and is formed with a positioning hollow and a detection target, and,
the positioning means includes a plurality of first positioning members formed on an opposite surface of the lid main body and a plurality of second positioning members formed on an opposite surface of the cover plate, the plurality of first positioning members are arranged with an interval and made different in size each other and each first positioning member is curved with an opening defined around between both ends thereof while the plurality of second positioning members are arranged with an interval and made different in size each other and each second positioning member is curved along the first positioning member and curved with an opening defined around between both ends thereof.

5. The substrate storage container according to claim 1, wherein the posture control member is configured to prevent rotation of the rotating operation portion from losing balance with respect to a thickness direction of the lid body.

6. The substrate storage container according to claim 1, wherein the posture control member is a projection in which a tip of the projection has a semicircular section.

7. The substrate storage container according to claim 2, wherein the posture control member is a projection in which a tip of the projection has a semicircular section.

8. A substrate storage container comprising:
a container body for storing a substrate;
a lid body for opening and closing an opening of the container body; and
a locking mechanism for locking the lid body that has closed the opening of the container body, wherein
the lid body includes a lid main body to be fitted to the opening of the container body and a cover plate for covering an open surface of the lid main body,
the locking mechanism includes a rotating operation portion that is supported by the lid main body and rotationally operated from an outside of the cover plate and a plurality of locking members that slide as the rotating operation portion rotates and project from, and retract into, a peripheral wall of the container body and come into and out of contact with an inner periphery of the opening of the container body, and
a posture control member for controlling a posture of the rotating operation portion is provided on, at least, the cover plate, among the cover plate of the lid body and the rotating operation portion of the locking mechanism,
the substrate storage container further comprising:
a fixing means for fixture between the lid main body and the cover plate of the lid body and a positioning means for positioning the cover plate to the lid main body, wherein
the cover plate has optical permeability and is formed with a positioning hollow and a detection target, and,
the positioning means includes a plurality of first positioning members formed on an opposite surface of the lid main body and a plurality of second positioning members formed on an opposite surface of the cover plate, the plurality of first positioning members are arranged with an interval and made different in size each other and each first positioning member is curved with an opening defined around between both ends thereof while the plurality of second positioning members are arranged with an interval and made different in size each other and each second positioning member is curved along the first positioning member and curved with an opening defined around between both ends thereof.

9. A substrate storage container comprising:
a container body for storing a substrate;
a lid body for opening and closing an opening of the container body; and
a locking mechanism for locking the lid body that has closed the opening of the container body, wherein
the lid body includes a lid main body to be fitted to the opening of the container body and a cover plate for covering an open surface of the lid main body,
the locking mechanism includes a rotating operation portion that is supported by the lid main body and rotationally operated from an outside of the cover plate and a plurality of locking members that slide as the rotating operation portion rotates and project from, and retract into, a peripheral wall of the container body and come into and out of contact with an inner periphery of the opening of the container body, and a posture control member for controlling a posture of the rotating operation portion is provided on, at least, the cover plate, among the cover plate of the lid body and the rotating operation portion of the locking mechanism, and the posture control member that comes into point contact or line contact with the lid main body of the lid body is provided in the rotating operation portion of the locking mechanism, the substrate storage container further comprising:

a fixing means for fixture between the lid main body and the cover plate of the lid body and a positioning means for positioning the cover plate to the lid main body, wherein the cover plate has optical permeability and is formed with a positioning hollow and a detection target, and, the positioning means includes a plurality of first positioning members formed on an opposite surface of the lid main body and a plurality of second positioning members formed on an opposite surface of the cover plate, the plurality of first positioning members are arranged with an interval and made different in size each other and each first positioning member is curved with an opening defined around between both ends thereof while the plurality of second positioning members are arranged with an interval and made different in size each other and each second positioning member is curved along the first positioning member and curved with an opening defined around between both ends thereof.

\* \* \* \* \*